(12) United States Patent
Zhou et al.

(10) Patent No.: US 7,566,852 B2
(45) Date of Patent: Jul. 28, 2009

(54) DRIVING CIRCUIT FOR BACKLIGHT MODULE

(75) Inventors: Wei Zhou, Shenzhen (CN); Yi-Yin Chen, Miao-li (TW)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 0 days.

(21) Appl. No.: 12/002,386

(22) Filed: Dec. 17, 2007

(65) Prior Publication Data

US 2008/0142687 A1 Jun. 19, 2008

(30) Foreign Application Priority Data

Dec. 15, 2006 (TW) .............................. 95147246 A

(51) Int. Cl.
*G01J 1/32* (2006.01)
(52) U.S. Cl. ........................................................ 250/205
(58) Field of Classification Search ................. 250/205, 250/214 AL
See application file for complete search history.

(56) References Cited

U.S. PATENT DOCUMENTS

| 5,818,553 | A | 10/1998 | Koenck et al. | |
|---|---|---|---|---|
| 2006/0025949 | A1* | 2/2006 | McCavit et al. | ............... 702/85 |

* cited by examiner

*Primary Examiner*—Seung C Sohn
(74) *Attorney, Agent, or Firm*—Wei Te Chung

(57) ABSTRACT

An exemplary driving circuit (400) for a backlight module includes a control circuit (420), a first driving branch circuit (440), a second driving branch circuit (450), and a light source (430). The control circuit is configured for providing a driving signal to the light source via the first driving branch circuit, and the second driving branch circuit is configured for providing a substitution driving signal to the light source according to intensity of ambient light beams. The first and second driving branch circuits are configured for driving the light source alternatively.

19 Claims, 1 Drawing Sheet

DRIVING CIRCUIT FOR BACKLIGHT MODULE

FIELD OF THE INVENTION

The present invention relates to driving circuits for backlight modules; and particularly to a driving circuit for a backlight module of a liquid crystal display (LCD) device, the driving circuit has a substitution power circuit.

BACKGROUND

LCD devices are commonly used as displays for compact electronic apparatuses. This is not only because they provide good quality images with little power consumption, but also because they are very thin. The liquid crystal layer in an LCD device does not emit any light beams itself. The liquid crystal layer has to be lit by a light source so as to clearly and sharply display text and images. Thus, a backlight module is generally needed for an LCD device.

A standard backlight module has no means for controlling its brightness. Therefore a viewer may see displayed images of the LCD device either easily or with difficulty, depending on the intensity of ambient light beams. Thus a better type of backlight module has been developed, with the backlight module being able to adjust its brightness according to the intensity of ambient light beams.

Referring to FIG. 2, this is a schematic, block diagram of a backlight module being capable of adjusting brightness. The backlight module 10 includes a power source 11, an ambient light detector 13, a control circuit 15, and a light source 17.

The power source 11 may be a battery, and provides a power to the control circuit 15 to drive the light source 17. The ambient light detector 13 is used to detect an intensity of ambient light beams, and accordingly generate a signal. The signal is supplied to the control circuit 15. The control circuit 15 generates a control signal according to the signal transmitted from the ambient light detector 13, and automatically modulates the light source 17 to emit light beams with desired brightness.

An operation process of the backlight module 10 includes the following steps. Firstly, the backlight module 10 is initialized after being supplied power, and the control circuit 15 generates an initial driving voltage/current to drive the light source 17. Secondly, the ambient light detector 13 detects variations of the intensity of the ambient light beams, generates a signal corresponding to the variations, and provides the signal to the control circuit 15. Thirdly, the control circuit 15 modulates the driving voltage/current according to the signal, generates a modulated driving voltage/current, and then outputs the modulated driving voltage/current to the light source 17. That is, when the intensity of the ambient light beams is great, the control circuit 15 generates a great driving voltage/current to drive the light source 17; when the intensity of the ambient light beams is low, the control circuit 15 generates a low driving voltage/current to drive the light source 17. Then, the light source 17 receives the modulated driving voltage/current and emits light beams accordingly.

However, when the intensity of the ambient light beams increases greatly, the brightness of the backlight module 10 increases greatly according to the increase of the intensity of the ambient light beams. Then, power consumption of the light source 17 increases, which shortens a working lifetime of the power source 11. Therefore, working lifetime of electronic apparatuses such as mobile phone, portable computer installed the backlight module 10, will be shortened, which causes inconvenience for users.

What is needed, therefore, is a driving circuit for a backlight module that can overcome the above-described deficiencies.

SUMMARY

A driving circuit for a backlight module is provided. In one aspect, the driving circuit includes a control circuit, a first driving branch circuit, a second driving branch circuit, and a light source. The control circuit is configured for providing a driving signal to the light source via the first driving branch circuit, and the second driving branch circuit is configured for providing a substitution driving signal to the light source according to intensity of ambient light beams. The first and second driving branch circuits are configured for driving the light source alternatively.

In another aspect, the driving circuit includes a control circuit, a first driving branch circuit, a second driving branch circuit, and a light source. The control circuit is configured for providing a driving signal to the light source via the first driving branch circuit. The second driving branch circuit is configured for converting an optical signal to an electric signal according to intensity of ambient light beams, and substituting for the first driving branch circuit to drive the light source when the electric signal is greater than the driving signal provided by the control circuit.

Other novel features and advantages will become more apparent from the following detailed description when taken in conjunction with the accompanying drawings.

BRIEF DESCRIPTION OF THE DRAWINGS

The emphasis in the drawings is placed upon clearly illustrating the principles of various embodiments of the present invention. Like reference numerals designate corresponding parts throughout various drawings.

DETAILED DESCRIPTION OF PREFERRED EMBODIMENTS

Reference will now be made to the drawings to describe preferred embodiments of the present invention in detail.

Figure 1:
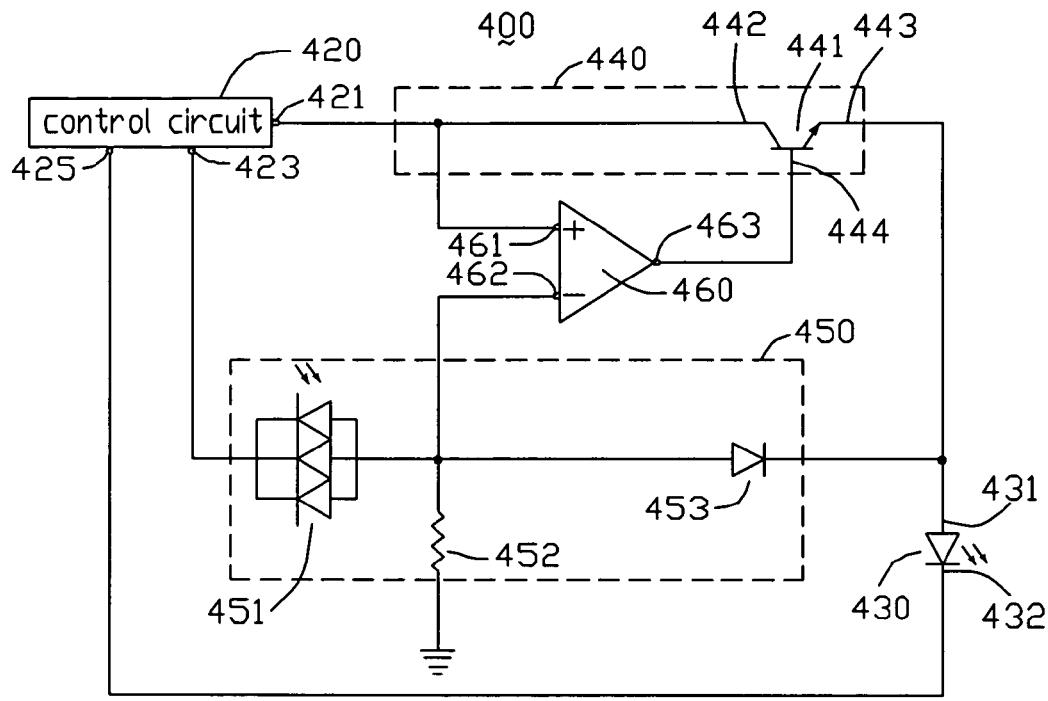
FIG. 1 is an abbreviated circuit diagram of a driving circuit for a backlight module according to a preferred embodiment of the present invention.
Figure 2:
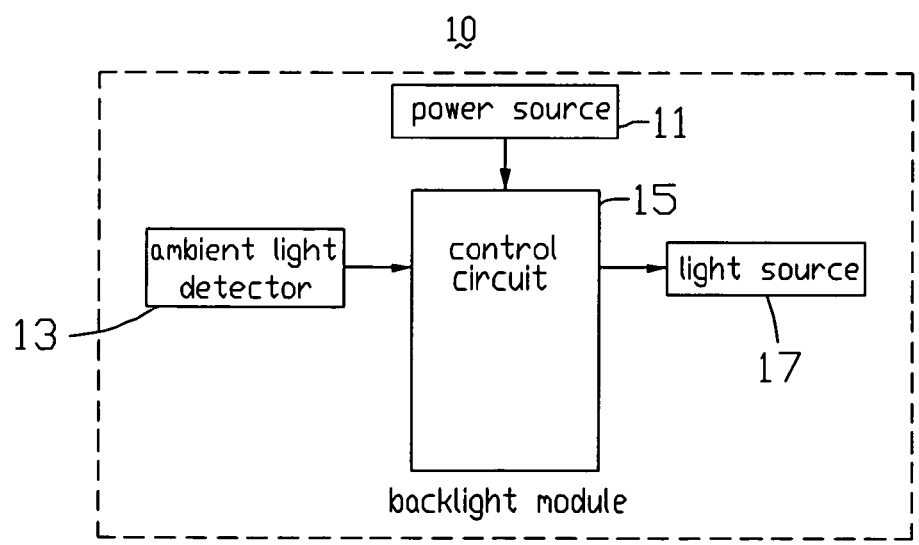
FIG. 2 is a schematic, block diagram of a conventional backlight module.

Referring to FIG. 1, a driving circuit 400 for a backlight module according to a preferred embodiment of the present invention is shown. The driving circuit 400 includes a control circuit 420, a light source 430, a first driving branch circuit 440, a second driving branch circuit 450, and a comparator 460. The control circuit 420 provides a driving signal from a power source (not shown) to the light source 430 via the first driving branch circuit 440, and a working voltage to the second driving branch circuit 450. The second driving branch circuit 450 provides a substitution driving signal to the light source 430.

The control circuit 420 may be an integrated circuit, and includes a first output terminal 421, a second output terminal 423, and an input terminal 425. The control circuit 420 provides a voltage to the first driving branch circuit 440 and the comparator 463 via the first output terminal 421, and a high level voltage to the second driving branch circuit 450 via the second output terminal 423. The input terminal 425 is a feedback input terminal, and is used for receiving a feedback signal from the light source 430.

The light source 430 includes a light emitting diode (not labeled), and the light emitting diode includes an anode 431 and a cathode 432. The anode 431 is connected to the first output terminal 421 of the control circuit 420 via the first driving branch circuit 440, and the cathode 432 is connected to the input terminal 425 of the control circuit 420.

The first driving branch circuit 440 may be a switching circuit, and includes a control switch 441. The control switch 441 includes an input terminal 442, an output terminal 443, and a control terminal 444. The input terminal 442 is connected to the first output terminal 421 of the control circuit 420, and the output terminal 443 is connected to the light source 430. The control switch 441 is controlled via the control terminal 444, if the control terminal 444 receives a high level signal, the control switch 441 is turned on; and if the control terminal 444 receives a low level signal, the control switch 441 is turned off. The control switch 441 may be a transistor, and the input terminal 442, the output terminal 443 and the control terminal 444 correspond to a source electrode, a drain electrode and a gate electrode of the transistor, respectively.

The second driving branch circuit 450 is used for convert an optical power to an electric power, and includes a photodiode array 451, a grounding resistance 452, and a diode 453. A cathode (not labeled) of the photodiode array 451 is connected to the second output terminal 423 of the control circuit 420, and an anode (not labeled) of the photodiode array 451 is connected to an anode (not labeled) of the diode 453 and also grounded via the grounding resistance 452. A cathode (not labeled) of the diode 453 is connected to the light source 430. The photodiode array 451 may be an array made of a plurality of photodiode units, and each photodiode unit includes a semiconductor element for converting an optical signal to an electric signal. Thus, when the photodiode array 451 is illuminated by light beams, the photodiode array 451 generates an optical current corresponding to the intensity of the light beams, and the optical current increases with increase of the intensity of the light beams and decreases with decrease of the intensity of the light beams. The photodiode array 451 may be also a single photodiode or replaced by other semiconductor element for converting an optical signal to an electric signal such as solar cells.

The comparator 460 may be a voltage comparator, and includes a positive input terminal 461, a negative input terminal 462, and an output terminal 463. The positive input terminal 461 is connected to the first output terminal 421 of the control circuit 420, the negative input terminal 462 is connected to the anode of the photodiode array 451, and the output terminal 463 is connected to the control terminal 444 of the control switch 441. When a voltage supplied to the positive input terminal 461 is greater than that supplied to the negative input terminal 462, the output terminal 463 outputs a high level signal. When the voltage supplied to the positive input terminal 461 is smaller than that supplied to the negative input terminal 462, the output terminal 463 outputs a low level signal.

An operation process of the driving circuit 400 includes the following steps. Firstly, the control circuit 420 receives an external signal, provides a voltage $V_{o1}$ to the positive input terminal 461 of the comparator 460 via the first output terminals 421, and another voltage $V_{o2}$ to the cathode of the photodiode array 451 via the second output terminal 423 to make the photodiode array 451 working in bias state.

Secondly, when the photodiode array 451 is illuminated by ambient light beams, the photodiode array 451 generates a photo current. The photo current flows through the grounding resistance 452, and the photodiode array 451 provides a voltage $V_i$ as a negative input voltage to the negative input terminal 462 of the comparator 460. The voltage $V_i$ increases with increase of the intensity of the ambient light beams and decreases with decrease of the intensity of the ambient light beams.

When the voltage $V_i$ is smaller than the voltage $V_{o1}$, the output terminal 463 of the comparator 460 outputs a high level signal. The high level signal is supplied to the control terminal 444 of the control switch 441 to turn the control switch 441 on. Thus, the voltage $V_{o1}$ is supplied to the cathode of the diode 453 via the first driving branch circuit 440. Because the voltage $V_i$ is smaller than the voltage $V_{o1}$, the diode 453 is at the block state, and the first driving branch circuit 440 drives the light source 430 to emit light beams. A driving current I flowing through the light source 430 is equal to a current $I_1$ flowing through the first driving branch circuit 440.

When the intensity of the ambient light beams increases to be great enough to make the voltage $V_i$ greater than the voltage $V_{o1}$, the diode 453 is turned on, and the output terminal 463 of the comparator 460 outputs a low level signal. The low level signal is supplied to the control terminal 444 of the control switch 441 to turn the control switch 441 off. Thus, the second driving branch circuit 450 drives the light source 430 to emit light beams. The driving current I flowing through the light source 430 is equal to a current $I_2$ flowing through the second driving branch circuit 450. The current $I_2$ changes with the intensity of the ambient light beams. If the intensity of the ambient light beams increases, the current $I_2$ increases, and then the driving current I flowing through the light source 430 increases, and the luminous intensity of the light source 430 increases. If the intensity of the ambient light beams decreases, the current $I_2$ decreases, and then the driving current I flowing through the light source 430 decreases, and the luminous intensity of the light source 430 decreases. And then, if the intensity of the ambient light beams decreases to make the voltage $V_i$ smaller than the voltage $V_{o1}$, the comparator 460 outputs a high level signal to turn the control switch 441 on. Thus, the first driving branch circuit 440 drives the light source 430 to emit light beams again.

In summary, when the intensity of the ambient light beams increases greatly, the driving circuit 400 can use the second driving branch circuit 450 as a substitution power circuit. The second driving branch circuit 450 can supply a driving current to the light source 430 according to the intensity of the ambient light beams. Therefore, the first and second driving branch circuits 440, 450 alternatively drive the light source 430, output power consumption of the first driving branch circuit 440 is reduced, which can make the power source of the backlight module working for a long time.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A driving circuit for a backlight module, comprising:
   a control circuit;
   a first driving branch circuit;
   a second driving branch circuit; and
   a light source;
   wherein the control circuit is configured for providing a driving signal to the light source via the first driving branch circuit, the second driving branch circuit is configured for providing a substitution driving signal to the light source according to intensity of ambient light beams, and the first and second driving branch circuits are configured for driving the light source alternatively.

2. The driving circuit as claimed in claim 1, wherein the first driving branch circuit is configured for driving the light source when the driving signal provided by the control circuit is greater than the substitution driving signal provided by the second driving branch circuit, and the second driving branch circuit is configured for driving the light source when the driving signal provided by the control circuit is smaller than the substitution driving signal provided by the second driving branch circuit.

3. The driving circuit as claimed in claim 2, wherein the second driving branch circuit is configured for converting an optical signal to an electric signal and generating an optical current increasing with increase of the intensity of the ambient light beams.

4. The driving circuit as claimed in claim 3, wherein the control circuit comprises a first output terminal and a second output terminal, the first output terminal is coupled to the first driving branch circuit, and the second output terminal is coupled to the second driving branch circuit.

5. The driving circuit as claimed in claim 4, wherein the second driving branch circuit comprises a semiconductor element for converting the optical signal to the electric signal and a grounding resistance, the semiconductor element comprises an anode and a cathode, the cathode is coupled to the second output terminal of the control circuit, and the anode is coupled to the light source and also grounded via the grounding resistance, and the optical current is capable of flowing through the grounding resistance.

6. The driving circuit as claimed in claim 5, wherein the semiconductor element is a photodiode array.

7. The driving circuit as claimed in claim 5, further comprising a comparator, wherein the comparator comprises a positive input terminal, a negative input terminal, and an output terminal, the positive input terminal is coupled to the first output terminal of the control circuit, the negative input terminal is coupled to the anode of the semiconductor element and the output terminal is coupled to the first driving branch circuit.

8. The driving circuit as claimed in claim 7, wherein the first driving branch circuit comprises a control switch, the control switch comprises an input terminal, an output terminal, and a control terminal, the input terminal is coupled to the first output terminal of the control circuit, the output terminal is coupled to the light source, and the control terminal is coupled to the output terminal of the comparator.

9. The driving circuit as claimed in claim 8, wherein the comparator is configured for outputting a high level signal via the output terminal to turn the control switch on when the driving signal provided by the control circuit is greater than the substitution driving signal provided by the second driving branch circuit, and outputting a low level signal via the output terminal to turn the control switch off when the driving signal provided by the control circuit is smaller than the substitution driving signal provided by the second driving branch circuit.

10. The driving circuit as claimed in claim 9, wherein the second driving branch circuit further comprises a diode, the diode comprises an anode and a cathode, and the semiconductor element is coupled to the light source via the anode and cathode of the diode.

11. The driving circuit as claimed in claim 1, wherein the control circuit further comprises a feedback input terminal, and the feedback input terminal is configured for receiving a feedback signal from the light source.

12. The driving circuit as claimed in claim 11, wherein the light source comprises a light emitting diode, the light emitting diode comprises an anode and a cathode, the anode of the light emitting diode is coupled to the first and second driving branch circuits, and the cathode of the light emitting diode is coupled to the feedback input terminal of the control circuit.

13. A driving circuit for a backlight module, comprising:
a control circuit;
a first driving branch circuit;
a second driving branch circuit; and
a light source;
wherein the control circuit is configured for providing a driving signal to the light source via the first driving branch circuit, the second driving branch circuit is configured for converting an optical signal to an electric signal according to intensity of ambient light beams, and substituting for the first driving branch circuit to drive the light source when the electric signal is greater than the driving signal provided by the control circuit.

14. The driving circuit as claimed in claim 13, wherein the second driving branch circuit comprises a semiconductor element for converting the optical signal to the electric signal and a grounding resistance, the semiconductor element is configured for generating an optical current flowing through the grounding resistance, and the optical current is capable of increasing with increase of the intensity of the ambient light beams.

15. The driving circuit as claimed in claim 14, wherein the second driving branch circuit further comprises a diode, the diode comprises an anode and a cathode, the semiconductor element is coupled to the light source via the anode and cathode of the diode, the cathode of the diode is also coupled to the first driving branch circuit, and the diode is capable of turning on when the electric signal is greater than the driving signal provided by the control circuit, and capable of turning off when the electric signal is smaller than the driving signal provided by the control circuit.

16. The driving circuit as claimed in claim 15, further comprising a comparator, wherein the comparator comprises a positive input terminal, a negative input terminal, and an output terminal, the positive input terminal is coupled to the control circuit for receiving the driving signal, the negative input terminal is coupled to the anode of the diode for receiving the electric signal, and the output terminal is coupled to the first driving branch circuit.

17. The driving circuit as claimed in claim 16, wherein the first driving branch circuit comprises a control switch, the control switch comprises an input terminal, an output terminal, and a control terminal, the input terminal is coupled to the control circuit for receiving the driving signal, the output terminal of the control switch is coupled to the light source, and the control terminal is coupled to the output terminal of the comparator.

18. The driving circuit as claimed in claim 17, wherein the comparator is configured for outputting a high level signal via the output terminal to turn the control switch on when the electric signal is smaller than the driving signal provided by the control circuit, and outputting a low level signal via the output terminal to turn the control switch off when the electric signal is greater than the driving signal provided by the control circuit.

19. The driving circuit as claimed in claim 14, wherein the semiconductor element is solar cells.

* * * * *